United States Patent
Bash et al.

(10) Patent No.: US 6,694,759 B1
(45) Date of Patent: Feb. 24, 2004

(54) PRESSURE CONTROL OF COOLING FLUID WITHIN A PLENUM USING AUTOMATICALLY ADJUSTABLE VENTS

(75) Inventors: Cullen E. Bash, San Francisco, CA (US); Chandrakant D. Patel, Fremont, CA (US); Abdimonem Beitelmal, Palo Alto, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/351,427

(22) Filed: Jan. 27, 2003

(51) Int. Cl.7 .............................. F25D 17/00; F24F 7/00
(52) U.S. Cl. ........................ 62/180; 236/49.3; 454/255
(58) Field of Search ........................ 62/177, 178, 180; 236/493; 454/238, 255, 340

(56) References Cited

U.S. PATENT DOCUMENTS

| | | | | |
|---|---|---|---|---|
| 4,406,397 A | * | 9/1983 | Kamata et al. | 236/1 B |
| 4,874,127 A | * | 10/1989 | Collier | 236/49.5 |
| 4,921,164 A | * | 5/1990 | Gotou et al. | 236/49.3 |
| 5,076,346 A | * | 12/1991 | Otsuka | 165/217 |
| 5,139,197 A | * | 8/1992 | Seshimo et al. | 236/49.3 |
| 5,152,814 A | * | 10/1992 | Nelson | 96/224 |
| 5,467,609 A | * | 11/1995 | Feeney | 62/259.2 |
| 5,468,184 A | * | 11/1995 | Collier | 454/186 |
| 5,718,628 A | * | 2/1998 | Nakazato et al. | 454/184 |
| 5,863,246 A | * | 1/1999 | Bujak, Jr. | 454/255 |
| 5,910,045 A | * | 6/1999 | Aoki et al. | 454/186 |
| 6,283,380 B1 | * | 9/2001 | Nakanishi et al. | 236/49.3 |
| 6,374,627 B1 | * | 4/2002 | Schumacher et al. | 62/259.2 |
| 6,412,292 B2 | * | 7/2002 | Spinazzola et al. | 62/89 |
| 6,574,104 B2 | * | 6/2003 | Patel et al. | 361/695 |

* cited by examiner

Primary Examiner—Marc Norman

(57) ABSTRACT

Cooling fluid pressure within a plenum of a cooling system is controlled by activating the cooling system, sensing pressure within the plenum in at least one zone of the data center, determining whether the pressure is within a predetermined pressure range, and modulating at least one of a plurality of automatically adjustable vents in response to the pressure being outside the predetermined pressure range.

29 Claims, 9 Drawing Sheets

PRESSURE CONTROL OF COOLING FLUID WITHIN A PLENUM USING AUTOMATICALLY ADJUSTABLE VENTS

BACKGROUND

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, micro-controllers, high speed video cards, memories, semi-conductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially static operation of conventional vents within data centers are generally designed to operate efficiently within a relatively narrow range of heat loads. However, if electronic components are allowed to exceed rated temperatures, data corruption or damage may result. Thus, conventional cooling systems and vent configurations typically operate in a worst-case scenario. For at least these reasons, cooling fluid is supplied to the components at around 100 percent of the estimated cooling requirement. In this respect, conventional cooling systems often attempt to cool components that may not be operating at a level which may cause its temperature to exceed a predetermined temperature range. Consequently, conventional data centers often incur greater startup costs for cooling systems sufficiently large to meet these cooling requirements as well as greater amounts of operating expenses than may be necessary to sufficiently cool the heat generating components contained in the racks of data centers.

Moreover, conventional vents within data centers are typically not automatically adjustable. Rather, conventional vents in data centers are usually provided as simple open grates for always full-open operation. Occasionally, data center vents are provided as manually adjustable between full open and full closed positions. Unfortunately, however, manually adjustable vents are not very useful in quickly and efficiently adapting to the ever-changing thermodynamics within a data center. Use of conventional vents within a data center also tends to give rise to negative air flow conditions or scavenging of air from a conditioned space through one or more of the vents. In other words, there are situations in which a cooling system actually pulls, instead of pushes, air back through a vent into the plenum and out a different vent. Scavenging typically occurs at the expense of a vent that is relatively distal the cooling system blower for the benefit of a vent located relatively proximate the blower. Such a condition is undesirable since it is typically desired to maintain neutral to positive air flow at each vent within a data center. One attempt to solve the scavenging problem is to simply increase the output of the blower. This may or may not cure the scavenging condition and definitely increases the cost of operating the cooling system and data center.

Finally, some data center vents are designed to maintain a continuous flow rate of air therethrough. For example, some vents include fans and other mechanisms for attempting to maintain a continuous flow rate of air. Such vent devices are operated based on input from sensor readings taken in the space to be conditioned. Unfortunately, however, such devices, in and of themselves, cannot solve the scavenging problem described above. The problem remains that underfloor plenum pressure intolerably fluctuates and is unpredictable. Accordingly, such non-uniform plenum pressure leads to scavenging and a lack of neutral to positive airflow to racks within a data center.

SUMMARY

According to an embodiment, the invention pertains to a method of controlling cooling fluid pressure within a plenum and of cooling a plurality of racks in a data center. The method includes activating a cooling system having a cooling device in fluid communication with the plenum, wherein the plenum is in fluid communication with a plurality of automatically adjustable vents that are configured to supply cooling fluid to the racks. Pressure is sensed within the plenum in at least one zone of the data center, and at least one of the plurality of automatically adjustable vents is automatically actuated in response to the pressure within the plenum being outside of a predetermined pressure range, thereby yielding a neutral-to-positive airflow at each of the plurality of automatically adjustable vents and thus substantially balancing the pressure within the plenum on a zonal basis.

According to another embodiment, the invention involves a cooling system for cooling racks in a data center. The system includes a cooling device for supplying cooling fluid to the racks, the cooling device including a fan. A plenum is provided in fluid communication with the fan of the cooling device. A plurality of automatically adjustable vents is provided in fluid communication with the plenum. A means for sensing pressure is provided within the plenum in at least one zone of the data center and produces output upon which the plurality of automatically adjustable vents automatically adjust to substantially balance the pressure within the plenum.

According to a further embodiment, the present invention includes a system for controlling cooling fluid pressure within a plenum of a cooling system for cooling a plurality of racks in a data center. The system includes a means for activating the cooling system, including a cooling device in fluid communication with the plenum. A means for sensing pressure is provided in at least one zone of the data center within the plenum. Means are provided for actuating at least one of a plurality of automatically adjustable vents in response to the pressure within the plenum being outside of a predetermined pressure range to yield a neutral-to-positive airflow at each of the plurality of automatically adjustable vents.

BRIEF DESCRIPTION OF THE DRAWINGS

Embodiments of the invention are illustrated by way of example and not limitation in the accompanying figures in which like numeral references refer to like elements, and wherein.

DETAILED DESCRIPTION

Figure 1:
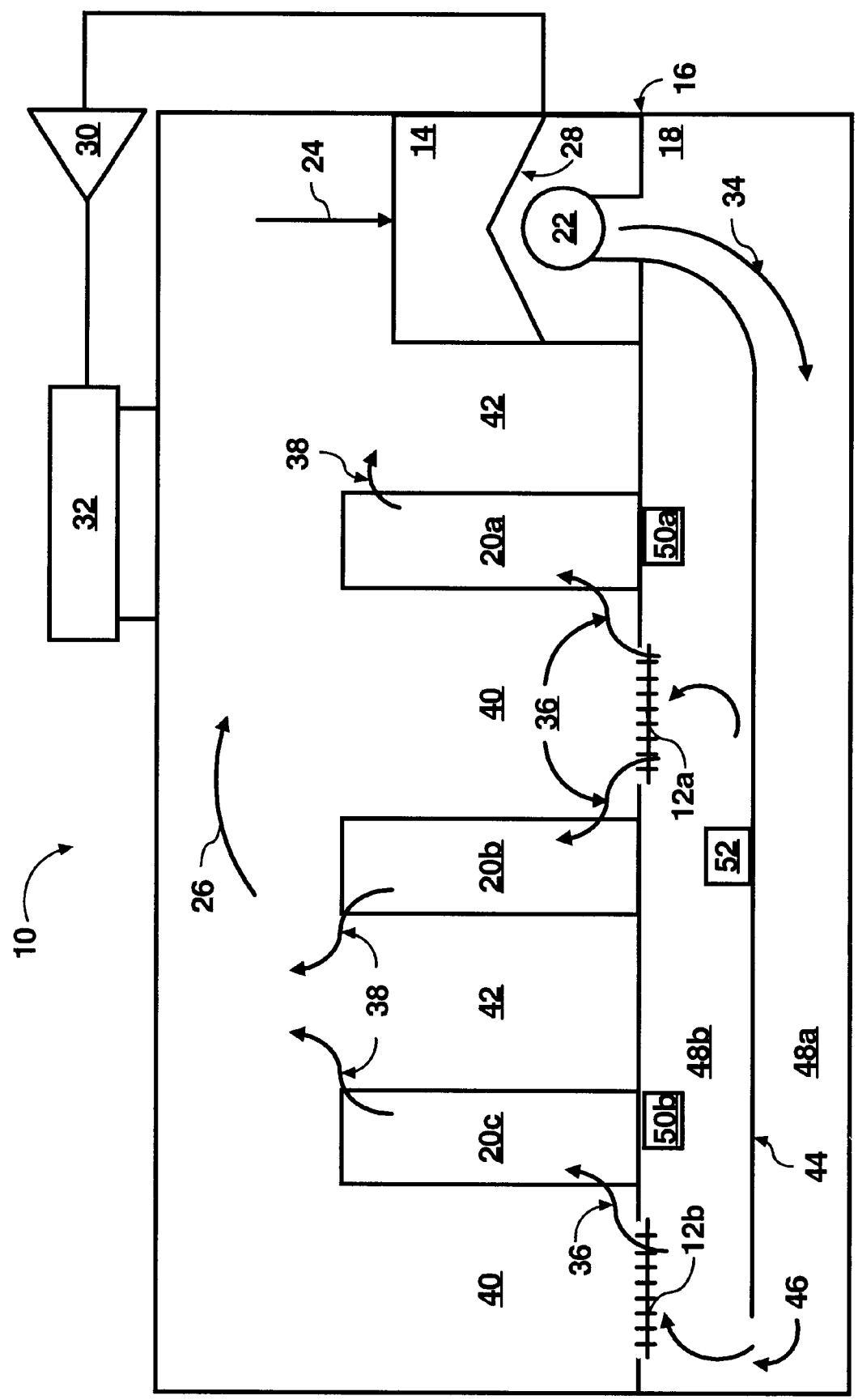
FIG. 1 shows a simplified schematic illustration of a data center containing a cooling system in accordance with an embodiment of the invention.

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structure have not been described in detail so as not to unnecessarily obscure the invention.

Generally, the cooling needs within a conditioned space of a data center fluctuate due to changes in heat dissipation by the racks. In turn, the pressure of cooling fluid at various locations within a plenum may fluctuate relative to one another. But, if the pressure of the cooling fluid within the plenum fluctuates in an uncontrolled or non-uniform manner, cooling fluid may be supplied to the various racks in an inefficient manner and may lead to scavenging of air from the conditioned space. Therefore, it is desirable to control the cooling fluid pressure within the plenum to achieve a more uniform distribution of pressure therein so that improved control of the flow of cooling fluid to the various racks may be attained. Moreover, automatically adjustable vents in fluid communication with a cooling system are configured to balance cooling fluid pressure within the plenum on a global or zonal basis to substantially yield or establish a neutral-to-positive, or non-negative, flow of cooling fluid at various automatically adjustable vents. Accordingly, a neutral-to-positive flow of cooling fluid may be provided to various racks located throughout the conditioned space of a data center, and scavenging of air from the conditioned space may be avoided.

Once a relatively uniform plenum pressure is achieved on a zonal basis, cooling fluid flow may be increased to those racks dissipating greater amounts of heat and may be decreased to those racks dissipating lesser amounts of heat on a localized basis, in order to reduce the amount of energy required to operate the cooling system. Thus, instead of requiring the operation of relatively high output devices, e.g., compressors, fans, etc., of the cooling system at substantially 100 percent of the anticipated heat dissipation from the racks, those devices may be operated according to the actual cooling needs.

Furthermore, the racks may be positioned throughout the data center according to their anticipated heat loads to thereby enable computer room air conditioning (CRAC) units located at various positions throughout the data center to operate in a more efficient manner. In another respect, the positioning of the racks may be determined through implementation of modeling and metrology of the cooling fluid flow throughout the data center. Moreover, the numerical modeling may be implemented to determine the volume flow rate and velocity of the cooling fluid flow through each of the vents.

In specific reference to the figures, there is shown in FIG. 1 a simplified schematic illustration of a data center 10 containing a plurality of vents 12a and 12b in fluid communication with a cooling system 14. The data center 10, according to this embodiment of the invention, includes a raised floor 16. A plurality of wires and communication lines (not shown) may be located in a plenum 18 beneath the raised floor 16. The plenum 18 is defined by the open space between the ground and the raised floor 16 and functions to deliver cooling fluid from the cooling system 14 to a plurality of racks 20a–20c. As will be described in further detail below, the plenum 18 may comprise a pressurized enclosure, such as a duct or conduit. Although the data center 10 is illustrated in FIG. 1 as containing three racks 20a–20c, two vents 12a and 12b, and a cooling system 14, it is to be understood that the data center may include any number of racks, e.g., 100 racks, vents, e.g., one or more, and cooling systems, e.g., one or more. Therefore, this depiction is for illustrative and simplicity of description purposes only and is not intended to limit the invention in any respect.

The racks 20a–20c generally house a plurality of components (not shown), e.g., processors, micro-controllers, high speed video cards, memories, semi-conductor devices, and the like. The components may be elements of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 20a–20c have been generally known to include upwards of forty (40) or more subsystems, they may require substantially large amounts of cooling fluid to maintain the subsystems and the components generally within a predetermined operating temperature range. According to an embodiment of the invention, by substantially individually and precisely controlling the amount of cooling fluid delivered to the components and the subsystems located in the racks 20a–20c based upon their respective heat loads, a relatively inexpensive or existing, essentially constant output cooling system 14 may be utilized in a more efficient manner than conventional cooling systems. According to another embodiment of the invention, by substantially controlling the amount of cooling fluid delivered to the components and the subsystems located in the racks 20a–20c based upon their respective heat loads, the power consumed by a variable output cooling system 14 to supply the cooling fluid may also be controlled in a more efficient manner as compared to a conventional cooling system.

The cooling system 14 generally includes a fan 22 for supplying cooling fluid into the plenum 18 (e.g., pressurized enclosure). Air may be supplied to the fan 22 from the returned cooling fluid in the data center 10 as indicated by arrows 24 and 26. In operation, the returned cooling fluid enters into the cooling system 14 as indicated by arrow 24 and is cooled by operation of various well known components of a cooling system (e.g., cooling coil, compressor, condenser, chilled water heat exchange, etc.) and/or in any reasonably suitable manner generally known to those of ordinary skill in the art. In a specific example, the cooling system 14 may include a cooling coil 28, a compressor 30, and a condenser 32.

In various embodiments of the invention, the cooling system 14 may be a constant or variable output device. In an example of an essentially constant output cooling system, an embodiment may be practiced which increases the range of heat loads a subset of the plurality of cooling systems may be able to effectively cool. In this manner and by automatically turning individual cooling systems on or off, one or more of the cooling systems may remain off for periods of time. Thus increasing efficiency and saving resources. In addition, in a data center having one or more variable output cooling systems, for example, an embodiment may be practiced which increases efficiency by maintaining essentially the same cooling fluid pressure throughout the data center. In particular, pressure at relatively downstream (from a cooling system) locations within the plenum may be maintained at essentially the same pressure as relatively upstream locations. In this manner, vents in fluid communication with these relatively downstream locations may receive sufficient cooling fluid pressure to generate desired flow volume and/or velocity.

In one embodiment, the cooling system 14 may be a substantially constant output cooling system. That is, the fan 22 and/or the compressor 30 may operate at essentially one speed. In this embodiment, one or both of the fan 22 and the compressor 30 may be cycled on and off to control the output of the cooling system 14 based upon the overall cooling fluid needed by the heat loads in the racks 20a–20c. In another embodiment, the output of cooling system 14 may be varied based upon the cooling fluid needed by the heat loads in the racks 20a–20c. For example, the capacity of the compressor 30 and the speed of the fan 22 may both be modified to thereby control the temperature and the amount of cooling fluid flow delivered to the racks 20a–20c. While it is within the scope of the invention that a variable cooling system be utilized, for the sake of simplicity, only essentially constant output cooling systems will be discussed herein. However, a more detailed description of variable cooling systems may be found in co-pending U.S. application Ser. No. 09/970,707, filed Oct. 5, 2001, which is assigned to the assignee of the present invention and is incorporated by reference herein in its entirety. Because the specific type of compressor 30 and fan 22 to be employed with the embodiments of the invention may vary according to individual needs, the invention is not limited to any specific type of compressor or fan. Instead, any reasonably suitable type of compressor 30 and fan 22 that are capable of accomplishing certain aspects of the invention may be employed with the embodiments of the invention. The choice of compressor 30 and fan 22 may depend upon a plurality of factors, e.g., cooling requirements, costs, operating expenses, etc.

The cooling fluid generally flows from the fan 22 and into the plenum 18 as indicated by the arrow 34. The cooling fluid flows out of the raised floor 16 through the vents 12a and 12b that generally operate to control the velocity and the volume flow rate of the cooling fluid therethrough. In this regard, the vents 12a and 12b are automatically adjustable. Thus, according to this embodiment of the invention, the racks 20a–20c may receive substantially individualized and localized amounts of cooling fluid according to their heat loads. In addition, according to this and other embodiments of the invention, characteristics such as, flow velocity and pressure, of the cooling fluid within the plenum 18 may be controlled by operation of the vents 12a and 12b.

The arrows 36 indicate the general direction of travel of the cooling fluid out of the vents 12a and 12b and the arrows 38 indicate the general direction of travel of fluid heated by the heat dissipating components located within the racks 20a–20c. As may be seen in FIG. 1, areas within the data center 10 may comprise either cool aisles 40 or hot aisles 42, or a combination thereof. The cool aisles 40 are those aisles that include the vents 12a and 12b and thus receive cooling fluid for delivery to the racks 20a–20c. The hot aisles 42 are those aisles that receive air heated by the heat dissipating components in the racks 20a–20c.

In addition, various sections of each of the racks 20a–20c may also receive substantially individualized amounts of cooling fluid. By way of example, if the bottom halves of the racks 20a and 20b are operating at maximum power, thereby dissipating a maximum level of heat load, and the upper halves are operating at little or no power, the vent 12a may be configured to enable cooling fluid flow therethrough to have a relatively high volume flow rate with a relatively low velocity. In this manner, the cooling fluid may operate to generally supply greater cooling to the lower halves of the racks 20a and 20b, whereas the upper halves receive relatively lesser amounts of cooling fluid. In addition, if the upper half of the rack 20c is operating at approximately 50 percent of the maximum power, and the lower half is operating at little or no power, the vent 12b may be configured to enable cooling fluid flow therethrough to have a relatively low volume flow rate with a relatively high velocity. In this manner, the cooling fluid flow may have sufficient momentum to adequately reach and cool the upper half of the rack 20c. To provide sufficient cooling fluid velocity, it may be beneficial for the cooling fluid within the plenum 18 to have a relatively higher static pressure than outside of the plenum 18. For example, given a substantially constant fluid output from the cooling system 12, the static pressure within the plenum 18 may be controlled by controlling the fluid flow resistance through the vents 12a and 12b. Thus, in one respect, by controlling the fluid flow resistance through the vents 12a and 12b, sufficient static pressure may be maintained within the plenum 18 to provide adequate cooling fluid velocity and to avoid scavenging.

According to an embodiment of the invention, the cooling fluid supply for flow through each of the vents 12a and 12b may be maintained at a relatively uniform pressure. In this respect, the plenum 18 may include a divider 44. The length of the divider 44 may extend substantially along the entire length of the plenum 18, i.e., in the direction generally perpendicular to the plane of FIG. 1. The width of the divider 44 may extend from the cooling system 14 to substantially the end of the plenum 18 to thus create a gap 46 between a side edge of the divider 44 and a side surface of the plenum 18. The divider 44 generally divides the plenum 18 into two relatively separate chambers 48a, 48b. The first chamber 48a is in fluid communication with the outlet of the fan 22. The second chamber 48b is in fluid communication with the first chamber 48a substantially through the gap 46. In this respect, the cooling fluid flow originating from the fan 22 must travel substantially the entire width of the plenum 18, i.e., through the first chamber 48a, for the fluid flow to enter into the second chamber 48b.

The cooling fluid in the second chamber 48b may be maintained at a substantially uniform static pressure by virtue of the manner in which the cooling fluid is introduced into the second chamber 48b. The rate at which the cooling fluid is supplied into the first chamber 48a by the fan 22 may cause a relatively large amount of turbulence in the cooling fluid located in the first chamber 48a. The turbulence is generally greatest at the outlet of the fan 22 and generally decreases as the distance from the outlet increases. By virtue of the distance the cooling fluid must travel to enter into the second chamber 48b, the cooling fluid may have substantially stabilized, thus enabling the cooling fluid entering into the second chamber 48b to be relatively calm. In this respect, the divider 44 operates to provide a relatively consistent cooling fluid pressure supply for the vents 12a and 12b. This relatively consistent cooling fluid pressure may increase the predictability with which cooling fluid exits the vents 12a and 12b thus, increasing the efficiency of cooling components within the racks 20a–20c.

The pressure of the cooling fluid at various locations in the second chamber 48b may be measured by plenum pressure sensors 50a and 50b. In this respect, the pressure sensors 50a and 50b may detect any discernable changes in the pressure of the cooling fluid at or near their respective locations within the second chamber 48b and relay that information to a vent controller (see FIG. 2). The vent controller may operate to control the vents 12a and 12b to modulate the flow of cooling fluid flowing therethrough and thereby control the static pressure within the second chamber 48b. For example, by generally reducing the flow out of the second chamber 48b relative to the flow into the second chamber 48b, static pressure within the second chamber 48b may be increased. In addition, by individually controlling the vents 12a and 12b, the static pressure at various locations within the plenum 18 may be controlled. Therefore, operation of the vents 12a and 12b may be related to cooling fluid pressures within the plenum 18, to the cooling requirements of the racks 20a–20c, and the amount of energy required to supply the racks 20a–20c with cooling fluid in a substantially optimized manner. In one respect, by increasing the efficiency with which the components contained in the racks 20a–20c are cooled, a substantial energy savings over known cooling systems may be realized.

In various embodiments of the invention, the capacity of the compressor 30 may be substantially constant or vary according to changes in the temperature of the cooling fluid located in the second chamber 48b. As such, a plenum temperature sensor 52 may be located within the second chamber 48b to relay temperature measurements to the cooling system 14. The plenum temperature sensor 52 may comprise any reasonably suitable temperature sensor known to those skilled in the art. Therefore, the compressor 30 may be operated to generally maintain the temperature of the cooling fluid within the second chamber 48b at a substantially constant level. For example, operation of the compressor 30 may be cycled on and off to control the temperature of cooling fluid output from the cooling system 14 in response to detected and/or anticipated changes in heat loads generated in the racks 20a–20c. In another embodiment, the capacity of the compressor 30 may vary according to detected and/or anticipated changes in heat loads generated in the racks 20a–20c. As an example, the compressor 30 capacity may be increased as the heat loads generated in the racks 20a–20c increase. In this regard, the power required to operate the compressor 30 may be substantially optimized, thereby reducing the total power required to operate the cooling system 14.

Figure 2:
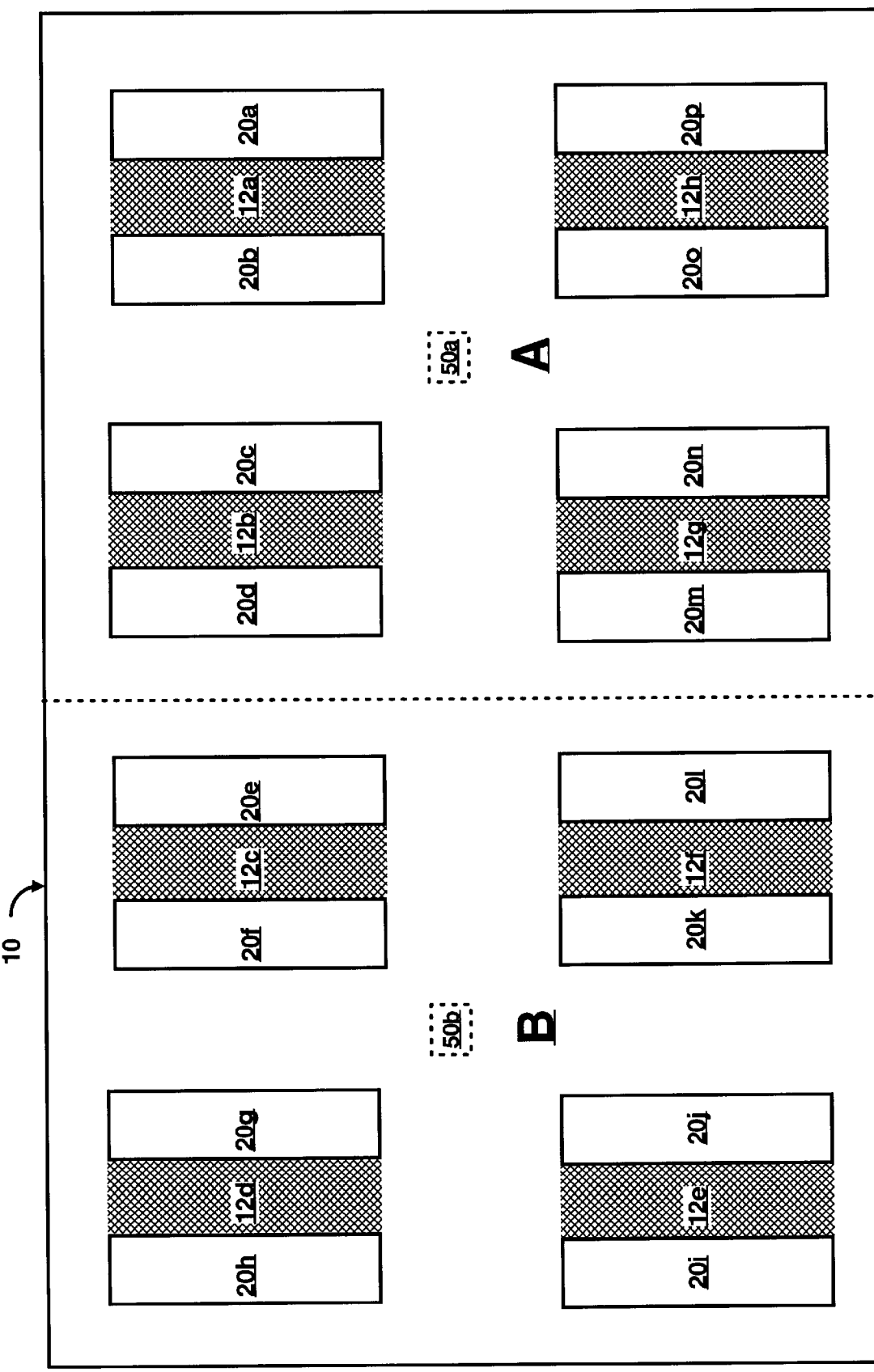
FIG. 2 shows a simplified schematic illustration of the data center of FIG. 1 including a plurality of zones, a plurality of pressure sensors, and a plurality of automatically adjustable vents.

FIG. 2 shows a simplified schematic plan view of the data center 10 including a plurality of zones A–B and the plurality of automatically adjustable vents 12a–h. The plurality of automatically adjustable vents is configured to supply cooling fluid to the plurality of racks 20a–20p as described hereinabove. The plurality of zones may include the plurality of pressure sensors 50a–50b that are configured to relay their respective measurements to the vent controller 204. For example, the pressure sensors 50a–50b may be located in the data center plenum respectively below each of the zones A and B as shown, or respectively below each of the plurality of vents 12a–12h. In other words, pressure sensors may be provided on a rack-by-rack or zone-by-zone basis. As used herein, zone encompasses the space to be conditioned above the raised floor, the plenum beneath the raised floor, or both. It is contemplated that the data center could encompass any desired number of different zones, e.g., from 1 to N zones. Cooling fluid pressures and pressure differences between the plurality of zones A–B may be controlled in a manner according to the method described below with reference to FIG. 4.

Figure 3:
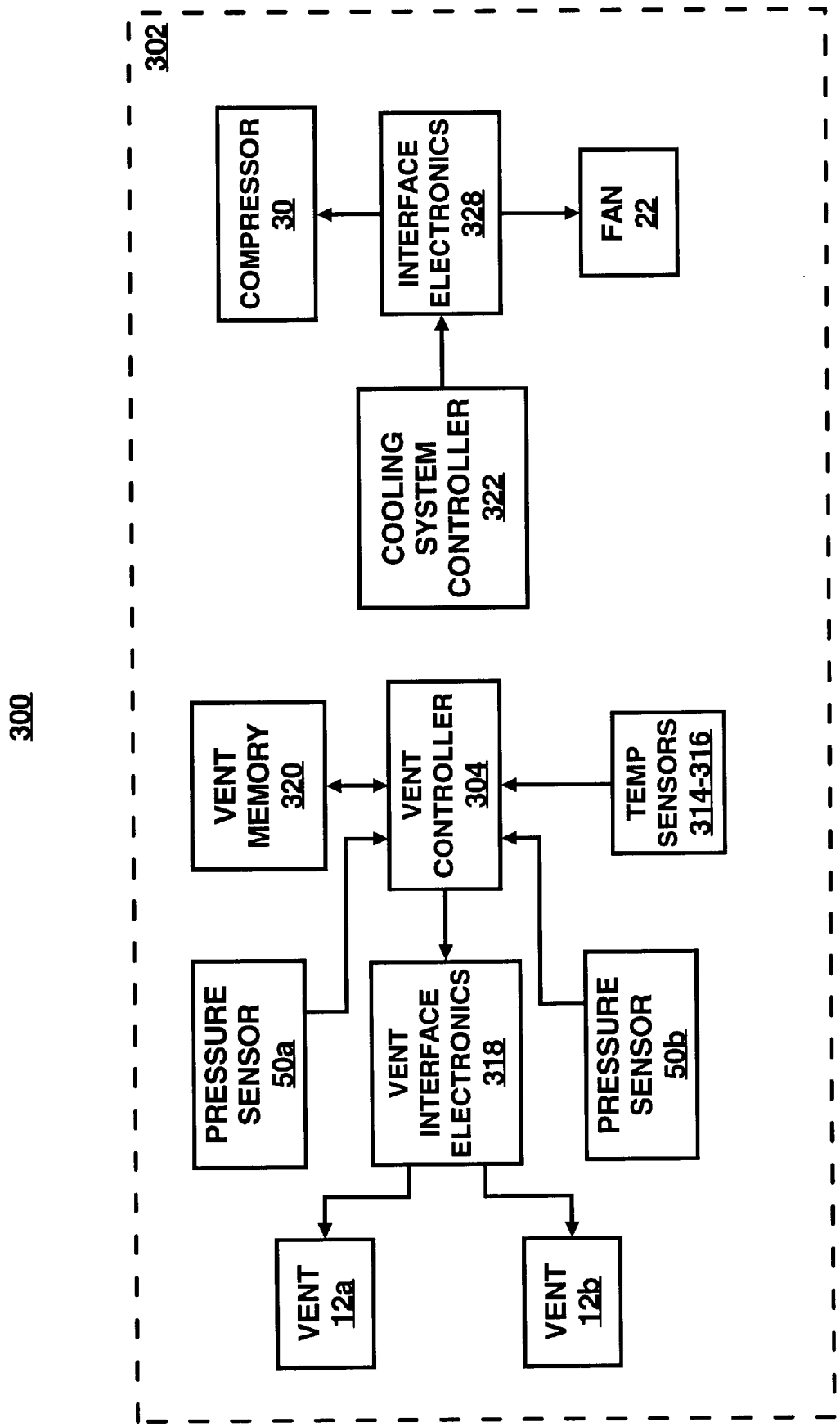
FIG. 3 illustrates a block diagram of a control scheme for a cooling system according to an embodiment of the invention.

Referring to FIG. 3, there is illustrated a block diagram 300 of a control scheme for a cooling system 302 according to an embodiment of the invention. The following description of the block diagram 300 is a relatively simplified manner in which the cooling system 302 may be operated. In this respect, it is to be understood that the following description of the block diagram 300 is but one manner of a variety of different manners in which such a cooling system 302 may be operated.

A vent controller 304 is generally configured to control the operation of the vents 12a and 12b. In this regard, the vent controller 304 may comprise a microprocessor, a micro-controller, an application specific integrated circuit (ASIC), and the like. The manner in which the vent controller 304 operates the vents 12a and 12b, i.e., the flow of cooling fluid therethrough, may be predicated upon the detected or anticipated pressures within the plenum and/or temperatures of the racks 20a–20c, or portions thereof.

For example, with regard to detected temperatures, a plurality of temperature sensors 312–316, e.g., thermocouples, may be positioned at various positions around the subsystems and/or the racks 20a–20c. Each of the temperature sensors 312–316 may correspond to a respective one of the vents 12a and 12b. By way of example, one temperature sensor 312 may affect the flow of cooling fluid flow through one vent 12a.

Alternatively, with regard to anticipated temperatures, anticipated cooling requirements for each of the racks 20a–20c and/or various sections of the racks may be predicated upon an impending load on the racks 20a–20c and/or sections of the racks. For example, the vent controller 204 may be connected to another controller, e.g., a central controller for the subsystems not shown), which anticipates the heat load the components and/or the subsystems will dissipate. This information may be relayed to the vent controller 204 which may then manipulate the vents 12a and 12b according to the anticipated load.

With regard to detected pressures, the pressure sensors 50a and 50b may relay pressure measurements and/or detected changes in the pressure within the plenum 18 to the vent controller 304. In general, the pressure is defined as the pressure difference between a location within the plenum 18 (generally below a vent 12a or 12b) and a location essentially above the respective vent 12a or 12b. The vent controller 304 may utilize this information to manipulate the vents 12a and 12b as described herein. Furthermore, in a manner similar to anticipating temperatures discussed above, pressures may be anticipated based on impending load on the racks 20a–20c and/or sections of the racks.

Although FIG. 3 illustrates three temperature sensors 312–316 and two pressure sensors 50a and 50b, it should be understood that the number of sensors is not critical to the operation of this embodiment of the invention. Instead, the cooling system 302 may include any reasonably suitable number of sensors to thus measure any reasonably suitable number of conditions within the data center 10 or portions thereof. The number of sensors and the measurements thereby may be upgradeable, e.g., scalable, to include any additional components, racks, and/or locations that may be included in the data center. In addition, the sensors need not be stationary. In this regard, according to another embodiment of the invention, a mobile device (not shown) is implemented to gather or measure at least one local environmental condition (e.g., temperature, pressure, air flow, humidity, etc.) in the data center 10. More particularly, the mobile device is configured to travel around the racks to determine the one or more environmental conditions at various locations throughout the data center. In addition, the device may be configured to detect the one or more environmental conditions at various heights throughout the data center.

A more detailed description of the above-described embodiment may be found in co-pending U.S. application Ser. No. 10/157,892, filed May 31, 2002, which is assigned to the assignee of the present invention and is incorporated by reference herein in its entirety.

If there is an actual detected change or an anticipated change in the temperature of the respective racks 20a–20c and/or portions thereof, the vent controller 304 generally operates to manipulate the corresponding vent 12a and 12b to compensate, i.e., changes the volume flow rate, velocity, and other similar characteristics of the cooling fluid, for the change in temperature. In this respect, each of the racks 20a–20c and/or portions thereof generally receives substantially only the amount of cooling fluid necessary to maintain the temperature of the portions of the racks within a predetermined temperature range. As will be seen from the discussion hereinbelow, by controlling the cooling fluid flow in this manner, an essentially constant output from the compressor 30 and/or the fan 22 may be manipulated to deliver a substantially optimized level of cooling to the racks 20a–20c, thereby increasing the efficiency of the cooling system and thus decreasing the operating costs required to operate these devices.

The vent controller 304 may manipulate the vents 12a and 12b based upon the sensed and/or anticipated pressure of the fluid at various locations in the plenum 18 to vary the flow of cooling fluid through the vents 12a and 12b, to thereby substantially maintain the pressure of the cooling fluid at these locations within a predetermined pressure variance. If there is an actual detected change or an anticipated change in the pressure differences between these locations, the vent controller 304 generally operates to manipulate one or more of the vents 12a and 12b to compensate, i.e., changes the volume flow rate of the cooling fluid, for the change in pressure difference. Thus, the vent controller 304 is operable to modulate the pressure within the plenum 18 substantially as indicated by the measured and/or anticipated heat loads in the racks 20a–20c. Consequently, the cooling system 302 may be more efficient than conventional cooling systems while utilizing relatively low cost, substantially constant speed devices (e.g., the compressor 30 and the fan 22). As will be seen from the discussion hereinbelow, by controlling the cooling fluid flow in this manner, sufficient pressure may be maintained throughout the plenum 18 to respond to detected or anticipated changes in the heat loads of the various components in the racks 20a–20c.

Vent interface electronics 318 may be provided to act as an interface between the vent controller 304 and the components, e.g., control the opening in the vents and the direction of cooling fluid flow through the vents, etc., for operating the vents 12a and 12b.

The vent controller 304 may also be interfaced with a vent memory 320 configured to provide storage of a computer software that provides the functionality of the cooling system and may be executed by the vent controller 304. The memory 320 may also be configured to provide a storage for containing data/information pertaining to the manner in which each of the vents 12a and 12b may be manipulated in response to the detected and/or anticipated temperatures of the portions of the racks 20a–20c. Furthermore, the memory 320 may be configured to store data/information pertaining to the control of the vents 12a and 12b corresponding to the measured pressures (and/or pressure differences) corresponding to various locations within the plenum 18. More particularly, a look up table (not shown) may be stored in the memory 320. By way of example, the look up table may include information pertaining to the direction of fluid flow, relative opening amount (e.g., 0 to 100%) for the vents 12a and 12b, pressures at the various locations, pressure differences, and the like. In this respect, the direction and amount open may be varied substantially incrementally in response to detected changes in the volume flow rate. The memory 320 may be implemented as a combination of volatile and non-volatile memory, such as dynamic random access memory (DRAM), EEPROM, flash memory, and the like.

Although FIG. 3 illustrates a single vent controller 304 configured to operate the vents 12a and 12b, it should be understood that a plurality of vent controllers may be implemented to perform the functions of the vent controller 304 without deviating from the scope and spirit of the invention.

In another embodiment, the plenum temperature sensor 52 may be configured to measure the temperature of the fluid within the second chamber 48b. The temperature measurements and/or any discernable changes in the temperature obtained by the plenum temperature sensor may also be relayed to the cooling system controller 322. In this regard, the cooling system controller 322 may, via interface electronics 328, manipulate the capacity of the compressor 30 based upon the measured temperature of the fluid. That is, the temperature of the fluid within the second chamber 48b may be maintained within a predetermined temperature range by manipulation of the compressor (e.g., cycled on and off, varied, and the like). In this manner, and in conjunction with the operation of the vents 12a and 12b as described hereinabove, the cooling system 352 may be operated relatively more efficiently than conventional cooling systems. Thus, the amount of energy necessary is substantially lower than that of conventional cooling systems.

Furthermore, although not illustrated in FIG. 3, it is within the scope of various embodiments of the invention that the vent controller 304 and cooling system controller 322 may intercommunicate. In this manner, the output of the cooling system may be modified in response to sensed and/or anticipated pressures within the plenum 18. Thus, the pressure within the plenum 18 may be maintained throughout a relatively greater range of cooling fluid volume flow demands. For example, if the pressure within the plenum rises above a predetermined level, data associated with the plenum pressure may be relayed to the cooling system controller 322 and the output of the fan 22 may be reduced (e.g., varied, cycled off and on, etc.). Similarly, if the pressure within the plenum falls below a predetermined level, data associated with the plenum pressure may be relayed to the cooling system controller 322 and the output of the fan 22 may be increased, for example. These manipulations of the cooling system may be performed in conjunction with control of the vents 12a and 12b as described hereinabove.

Figure 4:
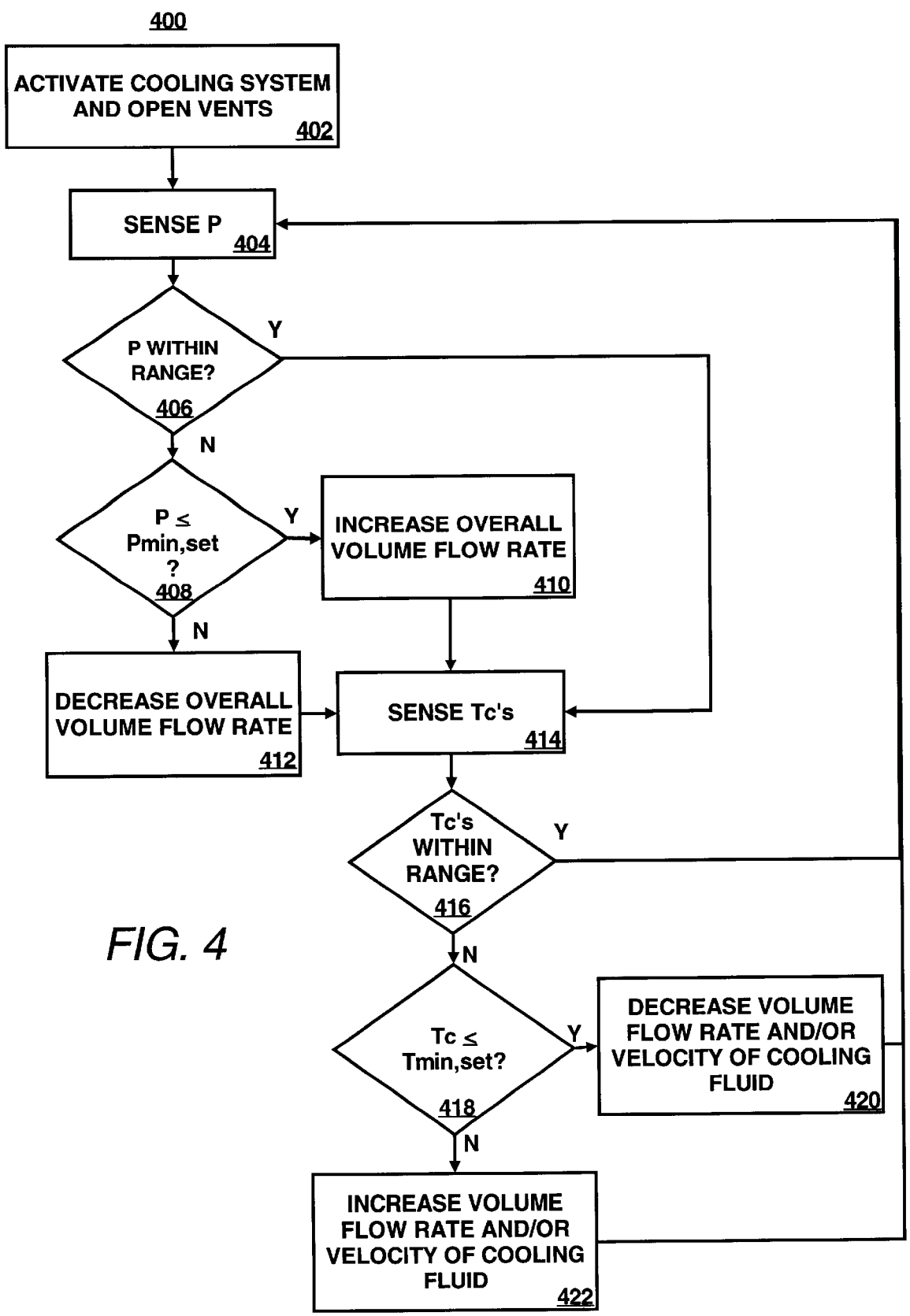
FIG. 4 shows a flow diagram of a manner in which an embodiment of the invention may be practiced.

FIG. 4 shows a flow diagram of a method 400 in which an embodiment of the invention may be practiced. The following description of the method 400 is made with reference to the block diagram 300 illustrated in FIG. 3, and thus makes reference to the elements cited therein. It is to be understood that the steps illustrated in the flow diagram may be contained as a utility, program, subprogram, in any desired computer accessible medium. In addition, the flow diagram may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the method 400 shown in the flow diagram, the cooling system 302 is activated at step 402. During this activation step, the various components of the cooling system 302 may be activated, initialized, etc. For example, control systems may be activated, the vents 12a and 12b may be opened, and the like. The pressure (P) within the plenum 18 generally is a function of vent flow resistance and the volume flow rate of air entering and exiting the plenum 18. Specifically, a pressure drop across any given vent is a function of the flow rate of air through the given vent and the air flow resistance that the given vent provides vis-a-vis the percentage opening of the vent. According to various embodiments of the invention, the flow volume exiting the plenum 18 may be modulated (such as by changing the percentage opening of the vents) based upon the heat load of the heat dissipating components in the racks 20a–20c. Thus, the P may be associated with the temperatures of specific heat dissipating components and subsystems. In addition, the pressures (P's) at various locations within the plenum 18 may be heterogeneous due to localized factors, such as, proximity to vents, distance from the cooling system, and the like. Therefore, the pressures at various locations within the plenum 18 may fluctuate based upon the temperatures in the general vicinity of the racks and/or sections of the racks. Thus, those skilled in the art will understand that certain embodiments of the invention may be employed with the temperature sensors 312–316 located at various positions throughout the data center.

The method 400 may be carried out on a zonal basis for steps 404–412 and on a more localized basis for steps 414–422. In other words, there may be a priority for stabilizing, equalizing, or balancing the plenum pressure on a zonal basis before attempting to cool individual racks or groups of racks on a more local level. The cooling fluid pressures ("P's") at various locations within the plenum 18 may be measured by the pressure sensors 50a and 50b at step 404. Alternatively, the P's may be anticipated in the manner described hereinabove with respect to FIG. 3. The information associated with the P's may be relayed to the vent controller 304. The vent controller 304 may determine whether any or all of the P's are within a predetermined pressure range at step 406. For those pressure readings determined to be within range, the method proceeds to step 414.

For those pressure readings determined to fall outside of the predetermined pressure range, i.e., fall outside of Pmin,set and Pmax,set, it is determined whether the sensed pressure(s) equals or falls below the Pmin,set at step 408. The predetermined pressure range may be based upon a plurality of factors, for example, a threshold operating range of pressures that may be determined through testing to substantially optimize the performance of the racks contained in the data center. Moreover, the predetermined pressure range may vary for each respective zone if desired. If the P's of one or more of the zones are below or equal to the Pmin,set, the vent controller 304 may operate to increase the volume flow rate and/or the velocity of cooling fluid to the vents in the vicinity of the low pressure reading, at step 410. Conversely, if the P's of one or more of the zones are above the Pmin,set, the vent controller 304 may operate to decrease the volume flow rate and/or the velocity of cooling fluid to the vents in the vicinity of the high pressure reading, at step 412. Thus, the vent controller 304 directs a plurality of vents in a zone to act in concert with one another to balance the pressures within the plenum. This could be accomplished by increasing the volume flow rate and/or velocity of cooling fluid at vents that are associated with P readings below Pmin,set while substantially simultaneously decreasing the volume flow rate and/or the velocity of cooling fluid at vents that are associated with P readings above Pmin, and especially those vents associated with or in the vicinity of P readings above Pmax, set. In other words, the controller will direct certain vents in a particular zone to increase the opening thereof at the expense of other vents in the zone which are directed to decrease the opening thereof. To enable this balancing strategy, the vent controller 304 can be preprogrammed with a lookup table for identifying and prioritizing which vents to close and open. Alternatively, or conjunctively, the vent controller 304 can be programmed with adaptive control algorithms to "learn" which vents to open and close to achieve pressure balance as quickly as possible.

As an alternative to steps 406–412, the vent controller 304 may determine a pressure differential (ΔP) between the P's and then determine whether the ΔP is within a predetermined acceptable pressure differential, e.g., between a predetermined maximum negative pressure variance and a predetermined maximum positive pressure variance, at step 406. The predetermined pressure differential may be set according to a substantial optimum operating pressure differential desired for controlling the flow of cooling fluid through the vents, through testing to determine the optimal flow characteristics, etc. If the ΔP is within the predetermined pressure differential, the vent controller 304 proceeds to step 414.

If, however, the ΔP does not fall within the predetermined pressure differential, i.e., falls outside of the predetermined maximum negative pressure variance or the predetermined maximum positive pressure variance, it is determined whether the ΔP is negative at step 408. The predetermined pressure differential may be based upon a plurality of factors, for example, a threshold operating pressure differential range that may be determined through testing to substantially optimize the flow of cooling fluid to the racks.

If the ΔP is negative, the vent controller 304 may operate to modulate the volume flow rate of cooling fluid through one or more vents to positively influence the ΔP at step 410. The determination of which vent(s) to modulate the volume flow rate of the cooling fluid therethrough may be based upon the detected pressures within the plenum 18, temperatures of the racks, and the like. For example, pressure measurements at various locations could be based on deviation from a pressure set point. Then, vents in zones of opposing pressure differentials from the set point can be manipulated to reduce deviation from the set point. Within a given zone, only vents that service particular racks that are below their maximum allowable temperature can be manipulated, thereby allowing movement of some, but not all, vents within a zone. In other words, if the pressure measured by pressure sensor 50a is relatively less than the pressure measured at pressure sensor 50b, and the temperature of rack 20c is relatively less than the temperatures of the racks 20a and 20b, the vent 12b may be modulated to decrease the flow therethrough by a relatively large amount and the vent 12a may be modulated to increase the flow therethrough by a relatively small amount. Similarly, if the pressure at pressure sensor 50a is relatively less than at pressure sensor 50b, and the temperature of rack 20c is relatively greater than the temperature of the racks 20a and 20b, the vent 12b may not be modulated (or depending on the temperatures and/or pressures, may be modulated to increase or decrease the flow therethrough by a relatively small amount) and the vent 12a may be modulated to decrease the flow therethrough.

Alternatively, if the ΔP is positive, and thus above the predetermined maximum positive pressure variance by virtue of the ΔP being outside the predetermined pressure differential, the vent controller 304 may operate to modulate the volume flow rate of cooling fluid through one or more vents to negatively influence the ΔP at step 412.

Furthermore, it is within the scope of various embodiments of this invention that the modulations performed in steps 410, 412, 420, and 422 may be combined and thus, performed once per cycle through steps 404–422. Also, in order to reduce the possibility of inducing fluctuations of a cyclic nature, modulations to regulate the pressure may be performed in increments that differ in degree as compared to those utilized to regulate temperature (e.g., in steps 420 and 422 below). For example, if at step 410, the vent 12a is modulated to increase the flow volume by 10 cubic feet per minute ("cfm"), then at step 420, the vents 12a and 12b may one or both be modulated to alter the flow volume by a lesser amount, e.g. 4 cfm. In this manner, the overall volume flow rate may remain relatively stable and the pressure within the plenum 18 may be substantially maintained.

Referring now to steps 414–422, the method involves cooling the racks within a data center on a localized basis, i.e., cooling individual racks or groups of racks after having stabilized the plenum pressure. Accordingly, the present invention substantially ensures a neutral-to-positive airflow to the racks without scavenging conditioned air from the vicinity of the racks. The temperature of a component (Tc) generally corresponds to the heat load of the heat dissipating components and therefore the subsystems contained in the racks 20a–20c. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the invention may be employed with the temperature sensors 312–316 located at various positions throughout the data center. Moreover, use of the term "rack" herein generally refers additionally to sections of the racks and thus may not necessarily refer to an entire rack. Thus, the use of the term "rack" throughout the disclosure is not meant to limit certain aspects to entire racks, but instead, is implemented to simplify the description of certain embodiments of the invention.

At step 414, the temperatures of the components (Tc's) are sensed by the temperature sensors 312–316.

Alternatively, the Tc's may be anticipated in the manner described hereinabove with respect to FIG. 3. Furthermore, it is within the scope of various embodiments of the invention that a plenum temperature is sensed by the plenum temperature sensor 52 and that the capacity of the cooling fluid within the plenum is regulated by the cooling system controller 322 in response to this sensed plenum temperature.

At step 416, it is determined whether the sensed temperatures of the components are within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

If the measured and/or anticipated temperatures are determined to fall within the predetermined range of operating temperatures, process returns to step 404. For those racks determined to have heat loads that do not fall within the predetermined temperature range, i.e., fall outside of Tmin,set and Tmax,set, it is determined whether the sensed temperature equals or falls below the Tmin,set at step 418. In general, the range of temperatures Tmin,set and Tmax,set pertains to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the vent controller 304 may operate to decrease the volume flow rate and/or the velocity of cooling fluid to those racks at step 420. The determination of whether to decrease either or both the volume flow rate and the velocity of the cooling fluid may be based upon the detected temperature of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the vent controller 304 may operate to increase the volume flow rate and/or the velocity of cooling fluid to those racks at step 422. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an embodiment of the invention, the decrease in volume flow rate and/or velocity of the cooling fluid flow at step 420 and the increase in volume and/or velocity of the cooling fluid at step 422 may be accomplished by incrementally varying the cooling fluid flow through the vents. An example will be made for the instance where a vent allows a certain amount of cooling fluid to flow therethrough, and the vent is manipulated to decrease the volume flow rate of the cooling fluid, and where the decrease in fluid flow is insufficient to cause the Tc for that rack to fall within the predetermined range. In this instance, during a subsequent run through steps 414–420, the vent may be controlled to further decrease the volume flow rate of the cooling fluid therethrough by an incremental amount. By repeating this process a number of times, the temperature of the rack may be substantially brought within the predetermined range.

It should be appreciated that the Tc's of some of the racks may fall below the Tmin,set, whereas the Tc's of other racks may exceed the Tmax,set. Thus, it should be appreciated that steps 420 and 422 may be respectively and substantially simultaneously performed on the various racks.

Figure 5:
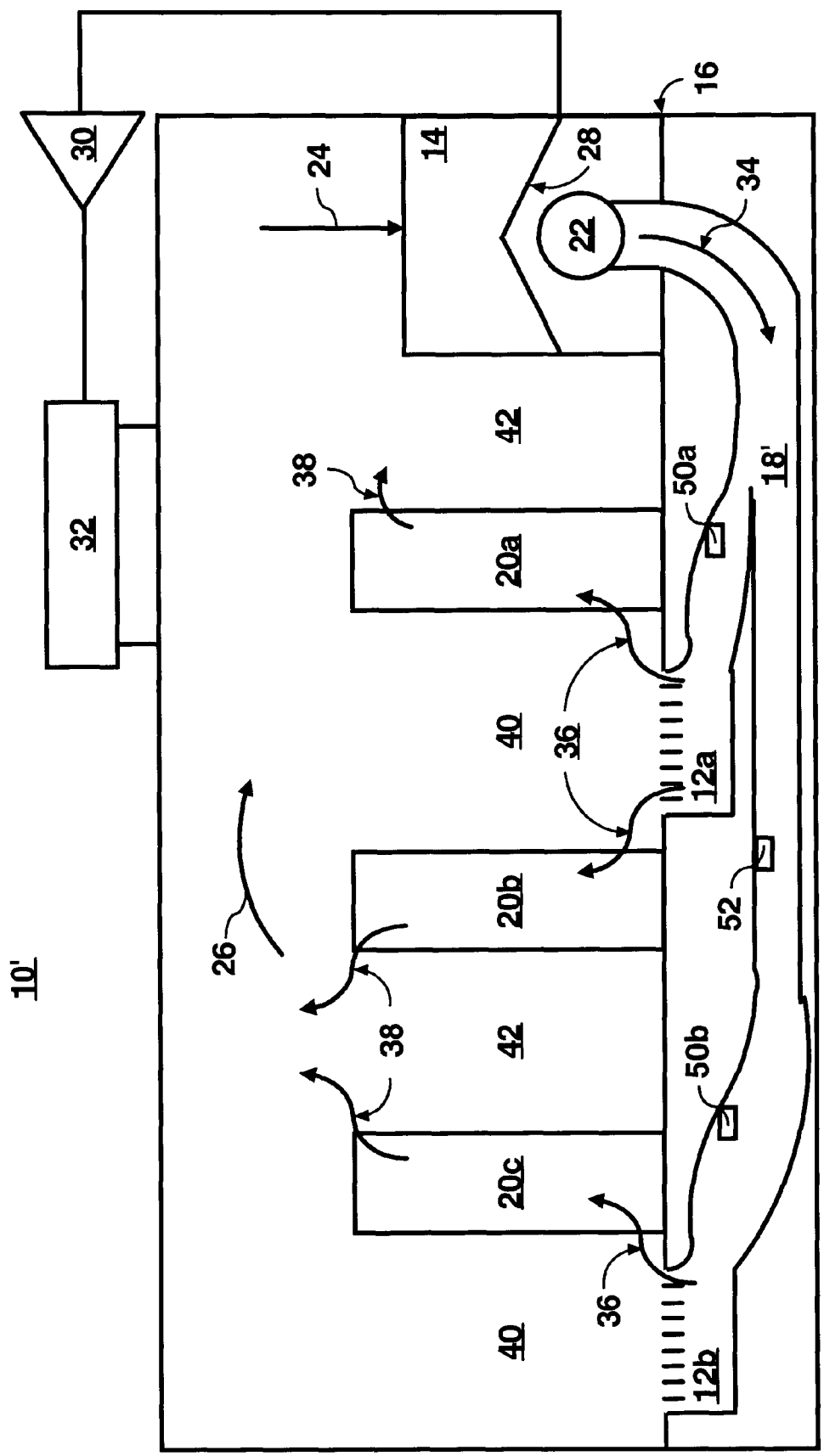
FIG. 5 shows a simplified schematic illustration of a data center in accordance with an alternate embodiment of the invention.

Following steps 420, 422, or 416 (if the ΔP is within the predetermined pressure differential), the P's are sensed again at step 404. In addition, the steps following step 404 may be repeated for an indefinite period of time so long as the cooling system 302 is in operation. In FIG. 5, there is illustrated a simplified schematic illustration of a data center 10' according to another embodiment of the invention. The elements illustrated in the data center 10' operate in substantially the same manner as those elements illustrated in the data center 10. However, one difference lies in the manner in which cooling fluid is supplied to the vents 12a and 12b. That is, a duct 18' (e.g., a plenum, pressurized enclosure, and the like) may provide an essentially direct connection from the cooling system 14 to the vents 12a and 12b. Because of the apparent similarities between the data centers 10 and 10', only those elements that differ between the FIGS. 1 and 5 will be described hereinbelow.

The duct 18' may be constructed from any suitable, essentially impermeable, material, e.g., metal, plastic, resin, etc. According to this embodiment of the invention, the duct 18' may placed under a new or existing raised floor 16 and thus, the raised floor 16 need not be configured to maintain the pressure of cooling fluid therein. Furthermore, it is within the scope of the invention that the duct 18' and vents 12a and 12b may be located in a raised ceiling (not shown), may be attached to a ceiling, may be placed near or on a wall, and/or may be located in any suitable location within the data center 10'.

Figure 6A:
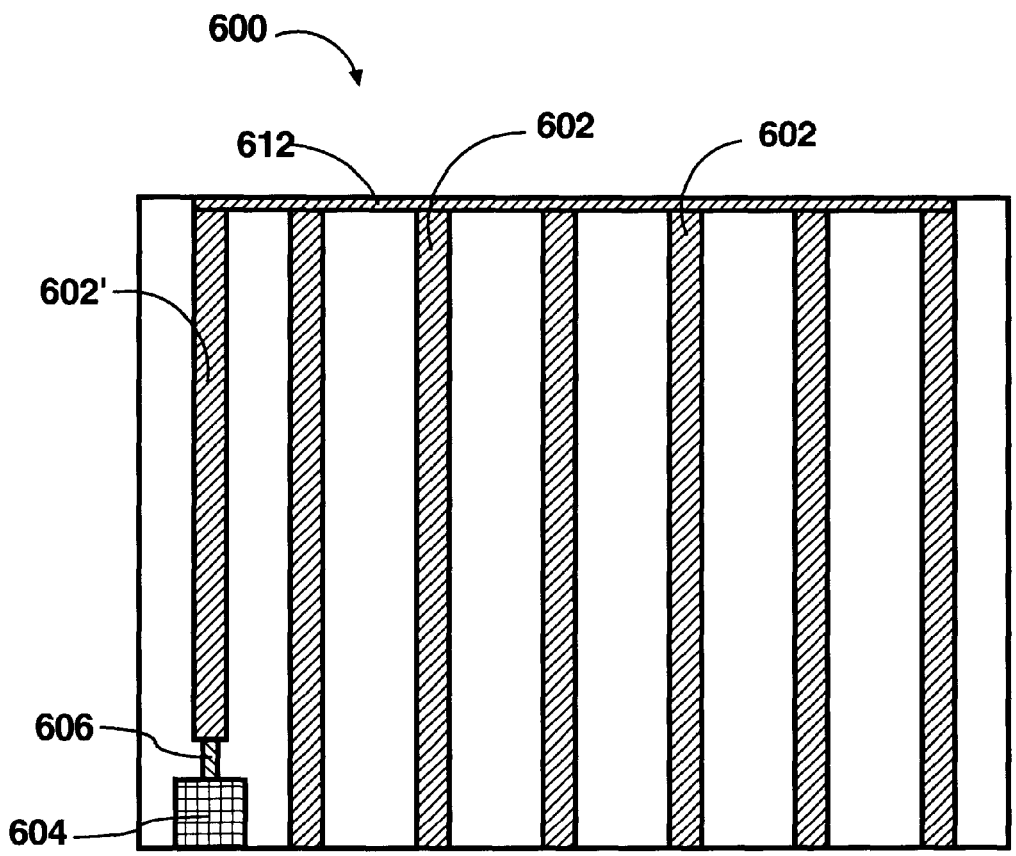
FIG. 6A shows a simplified schematic plan view of an automatically adjustable vent in accordance with an embodiment of the invention.
Figure 6B:
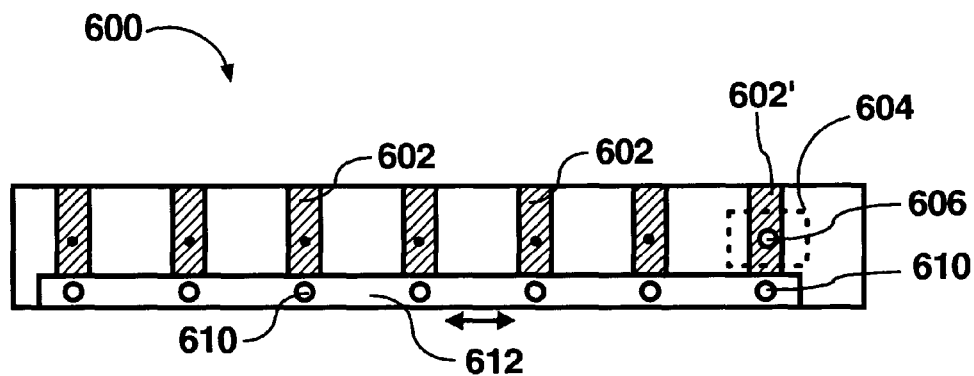
FIG. 6B shows a simplified rear view of the automatically adjustable vent of FIG. 6A.

FIGS. 6A–6B show simplified schematic illustrations of an automatically adjustable floor tile vent ("vent") 600 in accordance with an embodiment of the invention. In this regard, the vent 600 is an example of the vents 12a and 12b discussed hereinabove. The vent 600 may be constructed from any suitable structural materials, such as: metal, plastics, resin, composite, or the like. The vent 600 is basically a louvered vane vent including a plurality of spaced apart parallel vanes 602. A DC motor 604 is controlled by the vent controller of FIG. 2 and adjusts the rotation of a primary vane 602' via a drive shaft 606. The DC motor 604 may be rigidly attached to a vent housing 608 in any suitable manner. The drive shaft 606 is rigidly fixed to the primary vane 602' such that rotation of the DC motor 604 and drive shaft 606 results in rotation of the primary vane 602'. A drive pin 610 is press fit into the opposite end of the primary vane 602' and is press fit into a transfer bar 612 to interlock the primary vane 602' and transfer bar 612 together. The transfer bar 612 is rotatably attached to all of the other vanes 602 via transfer pins 614. Thus, rotation of the primary vane 602' causes the transfer bar 612 to translate, thereby causing the vanes 602 to pivot about their pivotable mounting axes. Accordingly, flow rate and flow direction of cooling fluid can be adjusted through the vent 600. In other words, the vent 600 may be operable to control characteristics of cooling fluid flow within a plenum.

Figure 7A:
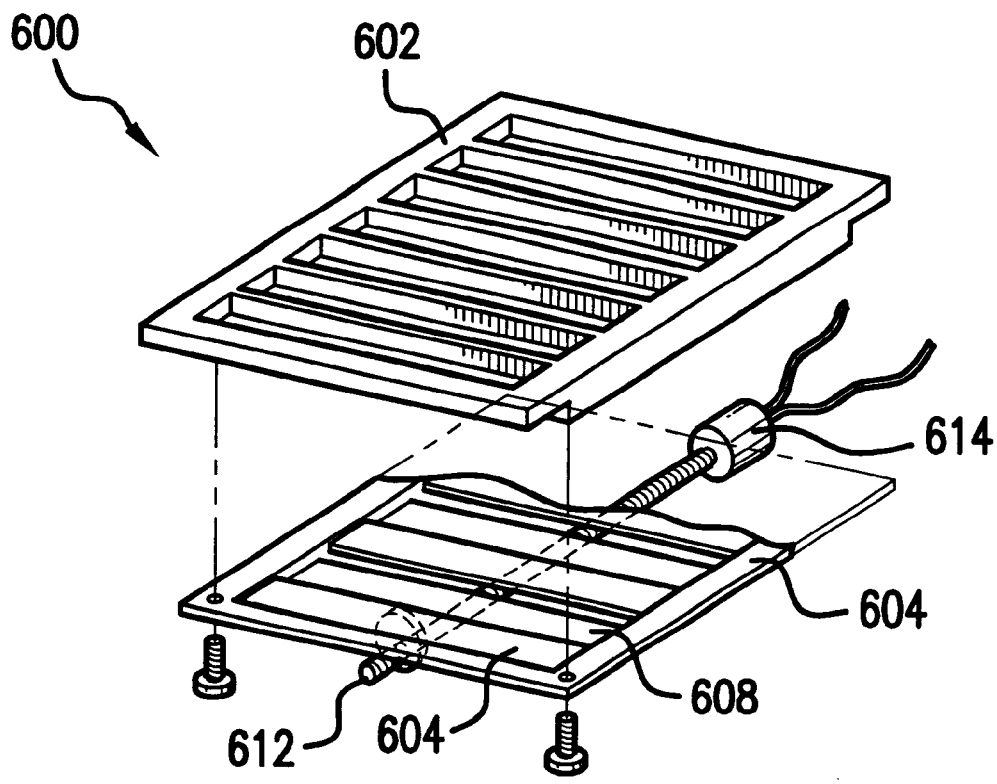
FIG. 7A illustrates an exploded perspective view of a retrofit automatically adjustable vent according to another embodiment of the invention.
Figure 7B:
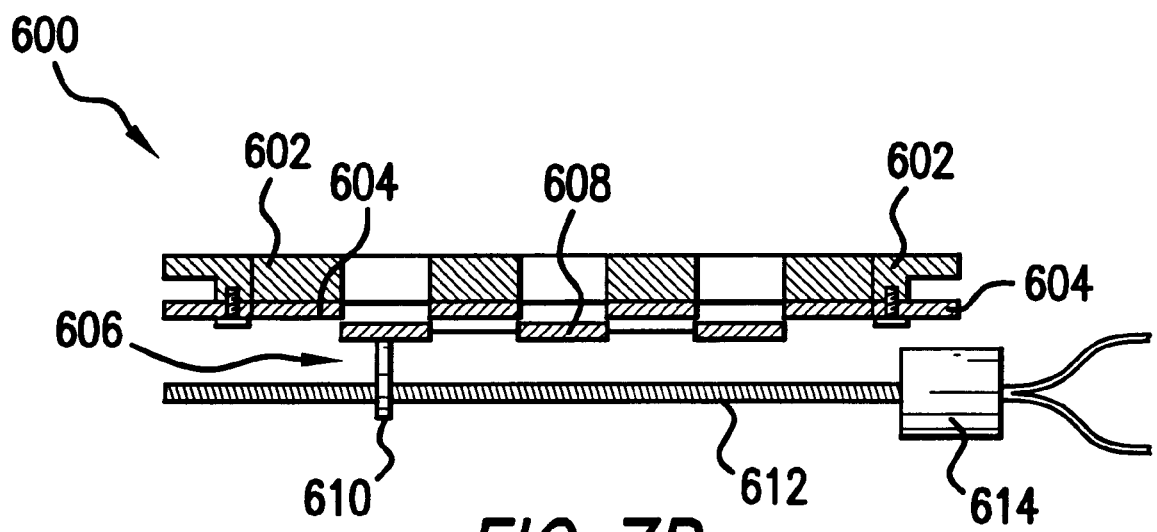
FIG. 7B illustrates a cross-sectional side view of the retrofit automatically adjustable vent of FIG. 7A.

FIGS. 7A–7B are simplified illustrations of an automatically adjustable vent 600 in accordance with another embodiment of the invention. As shown in FIG. 7, the vent 600 includes a standard 2'×2' vent grille 602, which may be adapted for installation into the raised floor of the data center. The standard vent grille 602 may be converted to the automatically adjustable vent 600 according to one embodiment of the present invention by mounting aftermarket apparatus thereto, which includes a stationary vane plate 604 screwed to the underside of the grille 602 and further includes a moveable vane assembly 606 consisting of interconnected vanes 608, a drive link 610, drive screw 612, and drive motor 614. The drive motor 614 may be suspended from the stationary vane plate 604 to maintain the sliding relationship between the stationary vane plate 604 and the interconnected vanes 608. One of ordinary skill in the art will recognize that the drive motor 614 may be suspended by a metal bracket, zip tie, adhesive, or other attachment arrangements (not shown). As shown, the interconnected vanes 608 overlap the back of the stationary vane plate 604 to occupy a fully closed position between openings in the standard grille 602 and stationary vane plate 604. The interconnected vanes 608, however, are traversable back and forth to open and close the vent 600. The drive motor 614 is electrically connected to the vent controller, which as previously described, controls the drive motor 614 which in turn controls rotation of the drive screw 612, thereby causing translation of the drive link 610 and interconnected vanes 608 generally parallel with the longitudinal axis of the drive screw 612.

Figure 8A:
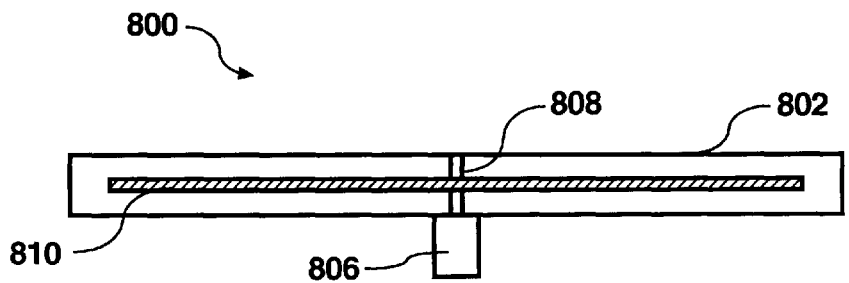
FIG. 8A shows a partial-sectional view of an automatically adjustable vent in accordance with yet another embodiment of the present invention.
Figure 8B:
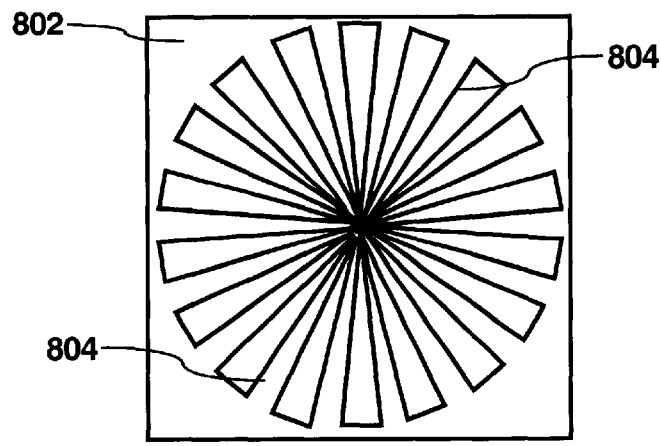
FIG. 8B shows a plan view of a housing of the automatically adjustable vent of FIG. 8A.
Figure 8C:
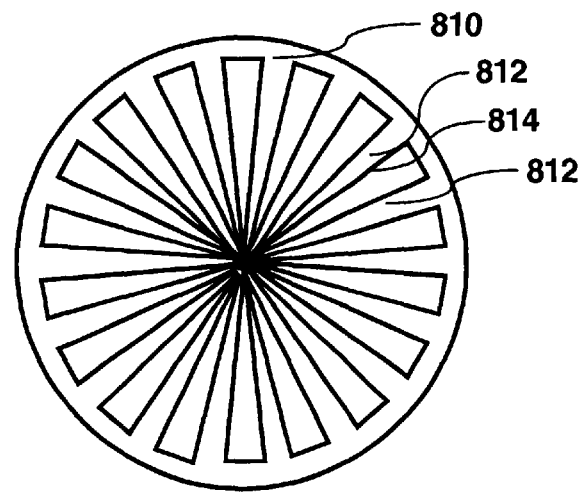
FIG. 8C shows a plan view of a vane disk of the automatically adjustable vent of FIG. 8A.

FIGS. 8A–8C illustrate an automatically adjustable vent 800 according to another embodiment of the present invention. The vent 800 includes a perforated housing 802 having a plurality of sector-shaped perforations 804 therein. A DC motor 806 is centrally mounted to the bottom of the housing 802 and includes a drive shaft 808 extending into the housing 802. A rotatable disk 810 is rigidly affixed to the drive shaft 808 within the housing 802. The disk 810 includes a plurality of sector-shaped vanes 812 having a plurality of spaces 814 therebetween. In a fully closed position, the sector shaped vanes 812 of the disk 810 overlap the sector-shaped perforations 804 of the housing 802 to prevent fluid flow through the vent 800. In a fully open position, the plurality of spaces 814 of the disk 810 overlap the plurality of sector-shaped perforations 804 of the housing 802 to permit fluid flow through the vent 800. The DC motor 806 is electrically connected to the vent controller, which as previously described, controls the DC motor 806 which in turn controls rotation of the disk 810. Thus, the disk 810 may be rotated between the open and closed positions to control the flow of fluid therethrough in order to aid in balancing plenum pressure.

One skilled in the art will recognize that the opening of each of the above-described embodiments can be monitored and a representative signal can be fed back to the vent controller. One way to carry out such a feature is to provide the motors with integrated position encoders. The position encoders could be calibrated with the hardware and vent controller to identify an open position of the moveable vanes, a closed position of the moveable vanes, and % opening therebetween. Another way to carry out this feature is to provide a separate optical sensor that is mounted to the vent to detect the % opening between open and closed positions. Thus, % opening signals can be fed back to the vent controller as input for determining how much to open or close a vent based on pressure readings.

Figure 9A:
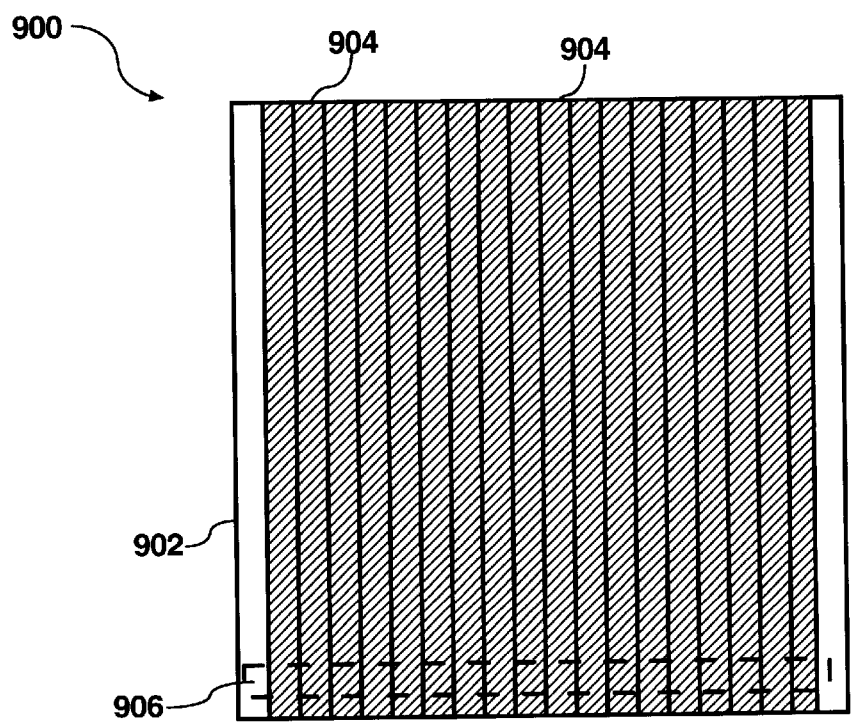
FIG. 9A illustrates a plan view of an automatically adjustable vent according to a further embodiment of the invention.
Figure 9B:
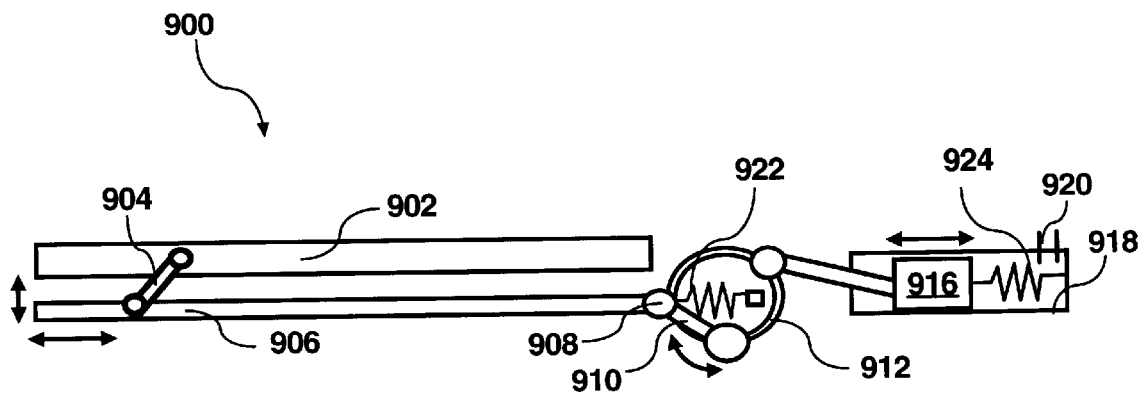
FIG. 9B illustrates a side view of the automatically adjustable vent of FIG. 9A further including a pressure sensing and actuating mechanism.

As discussed above, FIGS. 6A–8C illustrate actively controlled vents, i.e. vents that do not adjust unless explicitly directed to do so by the vent controller. In contrast and as discussed below, FIGS. 9A–9B depict a passively controlled vent embodiment that self-adjusts to pressure changes in the plenum. In other words, the passively controlled vent embodiment is a self-compensating device.

FIGS. 9A and 9B illustrate an automatically adjustable vent 900 according to yet another embodiment of the present invention. In contrast to the previously described automatically adjustable vents, this vent 900 is not actively controlled by a vent controller and does not operate based on input from electronic pressure sensor devices. Rather, this vent 900 is passively controlled or, in other words, is self-regulating and thereby operates relatively independently. It is recognized that the vent 900 is indirectly dependent upon the operation of other vents 900 within the data center. Nonetheless, the vent 900 operates based on its own "sensing" of plenum pressure somewhere within the data center, either in the vicinity of the vent 900 or even somewhere relatively remotely located from the vent 900. The operation of the vent 900 is based on creation of a pressure profile or differential between zones or within a zone of the data center. The pressure profile can be uniform or non-uniform and zones are designated based on how air is being delivered in the data center. For example, in a cold aisle/hot aisle system, a zone could be defined by an aisle. Alternatively, in a ceiling supply/return system, a zone could be defined by a group of tiles delivering air to a given cluster of racks.

The vent 900 includes a frame 902 and a plurality of vanes 904 pivotably mounted thereto. The vanes 904 are further pivotably connected to an actuator bar 906 that has one end 908 pivotably fixed to a tie rod 910. The tie rod 910 is pivotably fixed to a rotor 912 that is in turn pivotably fixed to another tie rod 914 of a pressure sensing piston 916 within a cylinder 918. The cylinder 918 includes a pressure tap 920 for communicating cooling fluid and plenum pressure against the piston 916. An actuator spring 922 is provided in compression to bias the actuator bar 906 up and to the left so as to close the gap between the actuator bar 906 and the frame 902 and thereby close the vanes 904. Similarly, a piston spring 924 is provided in tension to bias the piston 916 to the right, thereby rotate the rotor 912 clockwise and translate the actuator bar 906 and vanes 904 to their closed positions. Thus, when air pressure falls below the collective spring force of the springs 922 and 924, the vent 900 closes. In contrast, when air pressure exceeds the collective spring force of the springs 922 and 924, the piston 916 translates to the left, thereby rotating the rotor 912 counterclockwise, drawing the actuator bar 906 to the right so as to open the gap between the actuator bar 906 and the frame 902 and thereby open the vanes 904.

Accordingly, the spring rates of springs 922 and 924 will dictate a predetermined plenum pressure or plenum pressure range under which the vent 900 will open. In other words, for a given pressure range from X to Y bar, the vent 900 will self-actuate. Below X bar, the vent 900 will not open. Above Y bar, the vent 900 is fully open and cannot open any further. In between X and Y bar, however, the % opening of the vent may continuously vary proportionately to increases and decreases in plenum pressure.

The spring rates may determine the incremental opening of the vent 900. For example, the spring rates may be the same for all vents 900 within a data center. Alternatively, using modeling or empirical measurements, the selected spring rates may vary from vent to vent within a data center in order to correctly balance the plenum pressure therein. In other words, one vent can be designed to have a different incremental opening than another vent for the same given pressure change in the cylinder, just by using different springs or spring rates. This feature enables the ability to provide a non-uniform flow pattern within the data center if necessary. Based on simulation modeling, the effectiveness of each vent in providing cooling capacity may be different for identical flow rates in the plenum. Accordingly, regardless of what the average plenum pressure may be, a uniform or non-uniform pressure distribution in the data center can be created.

As can be appreciated by one skilled in the art, direct control of the vents 900 using electronic pressure sensors and controllers are unnecessary with the present embodiment. Accordingly, plenum pressure can be adjusted simply, automatically, and relatively uniformly using the plurality of vents 900.

In accordance with an embodiment of the invention, the cooling requirements within a data center may be analyzed to substantially optimize the layout of the racks within the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid. In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially less than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another embodiment of the invention, a CFD tool may be implemented substantially continuously with the embodiments described hereinabove. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the vents to adequately cool the racks based upon an analysis of the data center layout and the heat loads. The CFD tool may be implemented to produce a numerical model of the data center to thus determine an optimized cooling distribution within the data center. A correlation of one or more of the following properties: velocity of the cooling fluid flowing through various sections of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. In addition, the correlation may substantially reduce the amount of time required for the CFD tool to perform the computing operations.

Thus, for example, with respect to FIG. 4, at step 410, a numerical model may be created to analyze an optimal manner in which the volume flow and/or the velocity of the cooling fluid may be increased while considering the of effects plenum pressures and/or of fluid flow from other racks. In this respect, based upon the analysis, the vent supplying that rack with cooling fluid and/or another vent may be caused to vary the volume flow and/or velocity of the cooling fluid. In addition, at step 412, the numerical model may be created to determine whether the cooling system output should be decreased based upon plenum pressures and/or the heat loads and the fluid flow throughout the data center. For example, if it is determined that a rack with an increasing heat load may receive a sufficient amount of cooling fluid by receiving cooling fluid from a vent generally away therefrom, the cooling system output may not be increased. Thus, by implementation of the CFD tool to generally analyze the fluid flow characteristics and the temperatures of the racks, the amount of energy required to sufficiently cool the racks in the data center may be substantially optimized.

By virtue of certain aspects of the invention, one of ordinary skill in the art will readily recognize that the amount of energy, and thus the costs associated with cooling the racks located within a data center may be substantially reduced. In one respect, by operating the cooling system to supply cooling fluid substantially only as needed by the racks, the cooling system may be operated at a relatively more efficient manner as compared to conventional cooling systems.

What has been described and illustrated herein is an embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of controlling cooling fluid pressure within a plenum and of cooling a plurality of racks in a data center, said method comprising:

activating a cooling system having a cooling device in fluid communication with said plenum, said plenum being in fluid communication with a plurality of automatically adjustable vents configured to supply cooling fluid to said racks;

sensing pressure within said plenum in at least one zone of said data center; and automatically actuating at least one of said plurality of automatically adjustable vents in response to said pressure within said plenum being outside of a predetermined pressure range, thereby substantially yielding a neutral-to-positive airflow at said plurality of automatically adjustable vents and thus substantially balancing said pressure within said plenum on a zonal basis.

2. The method according to claim 1, said automatically adjusting step comprising:

sensing a plurality of cooling fluid pressures at a plurality of locations within said plenum;

determining whether pressure differences between said plurality of sensed cooling fluid pressures are within a predetermined pressure differential; and modulating said at least one of said plurality of automatically adjustable vents in response to said pressure differences being outside said predetermined pressure differential.

3. The method according to claim 2, further comprising:

determining whether said pressure differences are below or equal to a predetermined maximum negative pressure variance.

4. The method according to claim 3, further comprising:

modulating said flow volume of said cooling fluid flowing through said at least one of said plurality of automatically adjustable vents to positively influence said pressure differences in response to said pressure differences falling below or equaling said predetermined maximum negative pressure variance; and modulating said flow volume of said cooling fluid flowing through said at least one of said plurality of automatically adjustable vents to negatively influence said pressure differences in response to said pressure differences being above said predetermined maximum negative pressure variance.

5. The method according to claim 2, further comprising:

sensing temperatures of said racks on a local basis;

determining whether said temperatures are within a predetermined temperature range; and locally varying said supply of cooling fluid to said racks in response to said temperatures falling outside of said predetermined temperature range.

6. The method according to claim 5, further comprising at least one of:

decreasing said supply of cooling fluid to at least one rack having a relatively lower temperature; and increasing said supply of cooling fluid to at least one rack having a relatively higher temperature.

7. The method according to claim 2, further comprising:

performing a numerical modeling of a pressure distribution and flow characteristics of the data center; and modulating said at least one of said plurality of automatically adjustable vents in response to said numerical modeling.

8. The method according to claim 1, wherein said automatically adjusting step comprises:

providing said plurality of automatically adjustable vents as a plurality of passively controlled self-compensating vents;

sensing pressure within said plenum at said plurality of self-compensating vents; and self-adjusting the opening of at least one of said plurality of self-compensating vents based on said sensing step.

9. A cooling system for cooling racks in a data center, said system comprising:

a cooling device for supplying cooling fluid to said racks, said cooling device including a fan;

a plenum in fluid communication with said fan;

a plurality of automatically adjustable vents in fluid communication with said plenum; and means for sensing pressure within said plenum in at least one zone of said data center, said means for sensing pressure producing output upon which said plurality of automatically adjustable vents automatically adjust to substantially balance the pressure within said plenum.

10. The system according to claim 9, further comprising:

a vent controller operable to control said plurality of automatically adjustable vents, wherein said vent controller is configured to control said pressure of said cooling fluid within said plenum; and said means for sensing pressure comprising a plurality of pressure sensors, wherein said vent controller is operable to modulate said plurality of automatically adjustable vents in response to said sensed pressure.

11. The system according to claim 10, further comprising:

a plurality of temperature sensors configured to measure temperatures of said racks on a local basis, wherein said vent controller is configured to control said plurality of automatically adjustable vents in response to said measured temperatures of said racks.

12. The system according to claim 11, wherein said vent controller is operable to independently control said plurality of automatically adjustable vents on the basis of an anticipated amount of heat generation by said racks.

13. The system according to claim 10, wherein said plurality of automatically adjustable vents comprises a plurality of actively controlled vents, said actively controlled vents being controlled by said vent controller.

14. The system according to claim 13, wherein said plurality of actively controlled vents comprises:

a plurality of louvered vanes comprising a primary vane and a plurality of secondary vanes;

a transfer bar pivotably connecting said plurality of louvered vanes; and a motor having a driveshaft rigidly connected to said primary vane, said motor in communication with said vent controller, wherein said motor is configured to rotate said driveshaft to pivot said primary vane and thereby cause said transfer bar to translate and thus induce said plurality of secondary vanes to pivot.

15. The system according to claim 13, wherein said plurality of actively controlled vents comprises:

a plurality of stationary slats having spaces therebetween;

a plurality of moveable interconnected slats having spaces therebetween and being positioned behind said stationary slats;

a drive link connected to at least one of said plurality of moveable interconnected slats;

a lead screw threaded through said drive link; and a motor connected to said lead screw and in communication with said vent controller, wherein said motor is configured to rotate said lead screw to translate said drive link back and forth and thereby cause said plurality of moveable interconnected slats to translate and thus open and close off said spaces of said plurality of stationary slats.

16. The system according to claim 13, wherein said plurality of actively controlled vents comprises:

a housing having a plurality of sector-shaped openings therein;

a disk having a plurality of sector-shaped vanes and a plurality of spaces therebetween, said disk being mounted within said housing; and a motor mounted to said housing, said motor having a driveshaft extending into said housing and centrally through said disk, wherein said motor is configured to rotate said driveshaft and said disk to open and close off said plurality of sector-shaped openings of said housing with said sector-shaped vanes of said disk.

17. The system according to claim 9, wherein said means for sensing pressure comprises a spring-biased piston, wherein said spring-biased piston is displaced upon exposure to plenum pressure forces that exceed a spring-bias force of said spring-biased piston.

18. The system according to claim 17, wherein said plurality of automatically adjustable vents comprises an actuator bar connected to a tie rod connected to a rotor, said rotor being connected to a second tie rod connected to said spring-biased piston, wherein said spring-biased piston is displaceable from a home position toward a distal position to rotate said rotor and displace said actuator bar, wherein said plurality of automatically adjustable vents are normally biased closed by at least one spring acting on at least one of said piston and said actuator bar.

19. A system for controlling cooling fluid pressure within a plenum of a cooling system for cooling a plurality of racks in a data center, said system comprising:

means for activating said cooling system, said cooling system including a cooling device in fluid communication with said plenum;

means for sensing pressure in at least one zone of said data center within said plenum; and means for actuating at least one of a plurality of automatically adjustable vents in response to said pressure within said plenum being outside of a predetermined pressure range to substantially yield a neutral-to-positive airflow at said plurality of automatically adjustable vents.

20. The system according to claim 19, wherein said plurality of automatically adjustable vents comprise a plurality of actively controlled vents.

21. The system according to claim 20, wherein said plurality of actively controlled vents comprises:

a plurality of louvered vanes comprising a primary vane and a plurality of secondary vanes;

a transfer bar pivotably connecting said plurality of louvered vanes; and a motor having a driveshaft rigidly connected to said primary vane, said motor in communication with said vent controller, wherein said motor is configured to rotate said driveshaft to pivot said primary vane and thereby cause said transfer bar to translate and thus induce said plurality of secondary vanes to pivot.

22. The system according to claim 20, wherein said plurality of actively controlled vents comprises:

a plurality of stationary slats having spaces therebetween;

a plurality of moveable interconnected slats having spaces therebetween and being positioned behind said stationary slats;

a drive link connected to at least one of said plurality of moveable interconnected slats;

a lead screw threaded through said drive link; and a motor connected to said lead screw and in communication with said vent controller, wherein said motor is configured to rotate said lead screw to translate said drive link back and forth and thereby cause said plurality of moveable interconnected slats to translate and thus open and close off said spaces of said plurality of stationary slats.

23. The system according to claim 20, wherein said plurality of actively controlled vents comprises:

a housing having a plurality of sector-shaped openings therein;

a disk having a plurality of sector-shaped vanes and a plurality of spaces therebetween, said disk being mounted within said housing; and a motor mounted to said housing, said motor having a driveshaft extending into said housing and centrally through said disk, wherein said motor is configured to rotate said driveshaft and said disk to open and close off said plurality of sector-shaped openings of said housing with said sector-shaped vanes of said disk.

24. The system according to claim 19, further comprising:

means for locally sensing temperatures within said data center;

means for determining whether said temperatures are within a predetermined temperature range; and means for locally varying said supply of cooling fluid in response to said temperatures falling outside of said predetermined temperature range.

25. The system according to claim 24, further comprising at least one of:

means for decreasing said supply of cooling fluid to at least one rack having a relatively lower temperature; and means for increasing said supply of cooling fluid to at least one rack having a relatively higher temperature.

26. The system according to claim 19, further comprising:

means for performing a numerical modeling of a pressure distribution and flow characteristics of the data center; and means for modulating said plurality of automatically adjustable vents in response to said numerical modeling.

27. The system according to claim 19, wherein said plurality of automatically adjustable vents comprises a plurality of passively controlled self-compensating vents.

28. The system according to claim 27, wherein said means for sensing pressure comprises a spring-biased piston, wherein said spring-biased piston is displaced upon exposure to plenum pressure forces that exceed a spring-bias force of said spring-biased piston.

29. The system according to claim 28, wherein said plurality of passively controlled self-compensating vents comprises an actuator bar connected to a tie rod connected to a rotor, said rotor being connected to a second tie rod connected to said spring-biased piston, wherein said spring-biased piston is displaceable from a home position toward a distal position to rotate said rotor and displace said actuator bar, wherein said plurality of automatically adjustable vents are normally biased closed by at least one spring acting on at least one of said piston and said actuator bar.

* * * * *